(12) United States Patent
Kim (10) Patent No.: US 7,358,786 B2
(45) Date of Patent: Apr. 15, 2008

(54) CONTROL SIGNAL GENERATOR, LATCH CIRCUIT, FLIP FLOP AND METHOD FOR CONTROLLING OPERATIONS OF THE FLIP-FLOP

(75) Inventor: Min-Su Kim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 20 days.

(21) Appl. No.: 11/128,294

(22) Filed: May 13, 2005

(65) Prior Publication Data
US 2005/0253640 A1 Nov. 17, 2005

(30) Foreign Application Priority Data
May 15, 2004 (KR) .................. 10-2004-0034548

(51) Int. Cl.
*H03K 3/356* (2006.01)
(52) U.S. Cl. .................. 327/202; 327/212
(58) Field of Classification Search .............. 327/202, 327/203, 212, 199, 208; 371/22.3, 22.5
See application file for complete search history.

(56) References Cited

U.S. PATENT DOCUMENTS

| | | | | |
|---|---|---|---|---|
| 5,130,568 A | * | 7/1992 | Miller et al. .......... | 327/202 |
| 5,175,447 A | * | 12/1992 | Kawasaki et al. ...... | 327/211 |
| 5,689,517 A | * | 11/1997 | Ruparel .................. | 714/731 |
| 5,719,878 A | * | 2/1998 | Yu et al. ................ | 714/726 |
| 6,181,179 B1 | * | 1/2001 | Kanba ................... | 327/202 |
| 6,477,097 B2 | | 11/2002 | Inoue | |
| 6,608,513 B2 | | 8/2003 | Tschanz et al. | |
| 6,617,902 B2 | | 9/2003 | Tokumasu et al. | |
| 2003/0025543 A1 | | 2/2003 | Itoh | |

FOREIGN PATENT DOCUMENTS

| | | |
|---|---|---|
| JP | 07-0249968 | 9/1995 |
| KR | 10-0251469 | 3/1998 |
| KR | 000002395 A | 6/1998 |
| KR | 000026568 A | 5/2000 |

OTHER PUBLICATIONS

Korean Office Action dated Nov. 28, 2005 (and English translation thereof).

* cited by examiner

*Primary Examiner*—Dinh T. Le
(74) *Attorney, Agent, or Firm*—Harness, Dickey & Pierce, P.L.C.

(57) ABSTRACT

A control signal generator, latch circuit, flip-flop and method for controlling operations in the flip-flop may be configured so as to efficiently perform latching and scanning operations in the flip-flop. The control signal generator may generate at least two pulses based on a scan enable signal being received in a first state and on a received clock signal, and may generate at least two internal clock signals based on the received clock signal, and based on the scan enable signal being received in a second state. The latch circuit may latch a received input signal based on the at least two pulses and may latch a received scan input signal based on the at least two internal clock signals.

26 Claims, 6 Drawing Sheets

FIG. 1 (CONVENTIONAL)

FIG. 2 (CONVENTIONAL)

FIG. 3 (CONVENTIONAL)

CONTROL SIGNAL GENERATOR, LATCH CIRCUIT, FLIP FLOP AND METHOD FOR CONTROLLING OPERATIONS OF THE FLIP-FLOP

CROSS-REFERENCE TO RELATED CASES

This application claims the benefit of Korean Patent Application No. 2004-34548, filed on May 15, 2004, in the Korean Intellectual Property Office, the disclosure of which is incorporated herein in its entirety by reference.

BACKGROUND OF THE INVENTION

1. Field of the Invention

The present invention relates to a control signal generator, a latch circuit, a flip-flop including the latch circuit and the control signal generator and a method for controlling operations in the flip-flop.

2. Description of the Related Art

Figure 1:
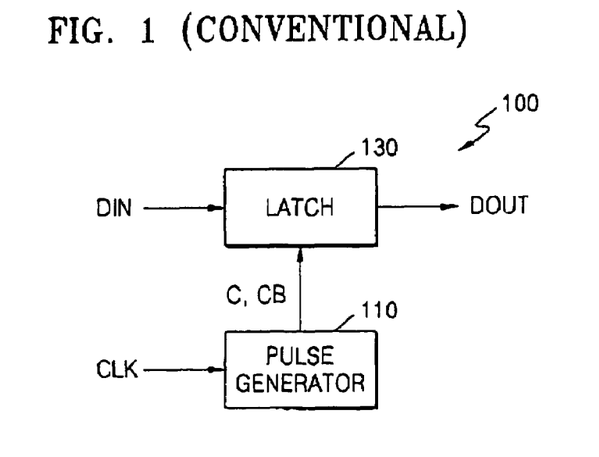
FIG. 1 is a block diagram of a conventional pulse-based flip-flop.

FIG. 1 is a block diagram of a conventional pulse-based flip-flop 100. In general, the conventional pulse-based flip-flop 100 is designed to operate at substantially fast speeds. The pulse-based flip-flop 100 typically includes a pulse generator 110 for generating complementary pulses C and CB (the pulses C and CB are complements of each other and may also be referred to as the normal and complement outputs of flip-flop 100, respectively) and a latch 130 latching an input signal (or data DIN) based on the complementary pulses to generate an output or result of the latching operation (DOUT).

Figure 2:
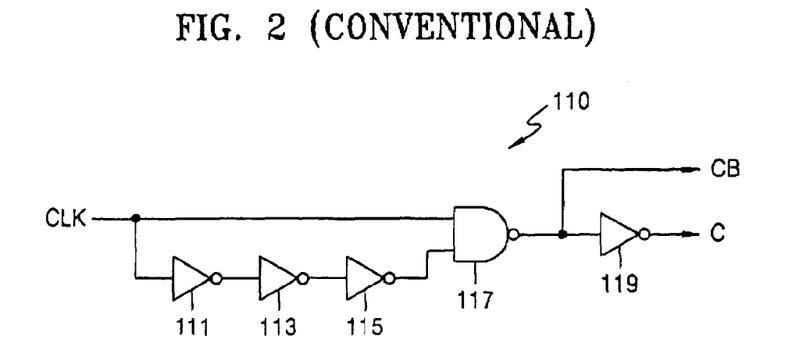
FIG. 2 is a circuit diagram of a pulse generator shown in FIG. 1.

FIG. 2 is a circuit diagram of the pulse generator 110. The pulse generator 110 typically includes a plurality of inverters 111, 113, 115, and 119 and a NAND gate 117. The NAND gate 117 receives a clock signal CLK and a delayed clock signal (delayed by the inverter chain 111, 113, and 115), combines the two clock signals in a NAND operation, and outputs a result of the NAND operation as a pulse CB. The inverter 119 inverts the pulse CB output by the NAND gate 117 and outputs a pulse C, as shown in FIG. 2.

Figure 3:
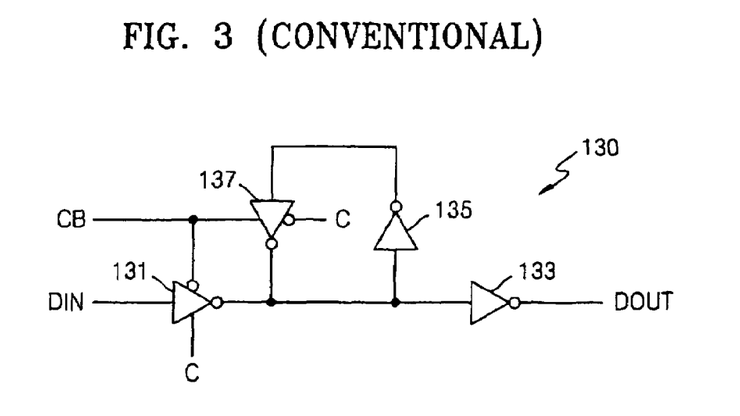
FIG. 3 is a circuit diagram of a latch shown in FIG. 1.

FIG. 3 is a circuit diagram of the latch 130. Referring to FIG. 3, the latch 130 of the conventional flip-flop 100 typically includes two tri-state buffers 131 and 137 and two inverters 133 and 135. The latch 130 generally receives the input signal DIN through an input port (at tri-state buffer 131) based on logic states of the complementary pulses C and CB, latches the input signal DIN, and outputs a result of the latching as an output signal DOUT.

A semiconductor chip typically may include a plurality of flip-flops that are packaged together. Since these flip-flops are packaged, the logics (e.g., logic circuits associated with flip-flops) existing in the chip may not be able to be properly tested. This is because accurate detection of whether each of the flip-flops in the chip are properly operating has proven to be substantially difficult.

Accordingly, each of the conventional flip-flops in the chip typically include a dedicated circuit to test whether the flip-flop operates properly, in addition to a latch circuit for latching a signal (or data). This dedicated circuit is referred to as a scan circuit. A flip-flop including a scan circuit may be commonly referred to as a flip-flop with scanning function.

However, the inclusion of a scan circuit in a flip-flop may increase power consumption of the flip-flop. Additionally, setup time for the flip-flop may increase, which may contribute to a greater input-to-output delay through the flip-flop. Consequently, this may lead to a reduction in operating speed of a semiconductor chip that includes a flip-flop with scanning function.

SUMMARY OF THE INVENTION

An exemplary embodiment of the present invention is directed to a control signal generator. The control signal generator may include a first NAND gate generating a first pulse based on a clock signal received at a first input port and an input signal received at a second input port, a first inverter inverting the first pulse to generate a second pulse, and a second NAND gate generating a first internal clock signal based on a scan enable signal and the clock signal. The control signal generator may include a second inverter inverting the first internal clock signal to generate a second internal clock signal, a third inverter inverting the signal from the second input port to generate an output signal, and a transmission circuit transmitting the clock signal to the second input port based on the scan enable signal and the output signal from the third inverter.

Another exemplary embodiment of the present invention is directed to a latch circuit. The latch circuit may include a first transmission circuit receiving an input signal and transmitting the input signal via an output port thereof based on at least two pulses, and a second transmission circuit receiving a scan input signal and transmitting the scan input signal via an output port thereof based on at least two internal clock signals. The latch circuit may include a first latch connected between the output ports of the first and second transmission circuits for latching an output signal from one of the first and second transmission circuits based on the at least two pulses.

Another exemplary embodiment of the present invention is directed to a latch circuit. The latch circuit may include a first transmission circuit outputting, as an output signal, one of a power supply voltage, a ground voltage and an impedance value based on an input signal and at least one pulse, and an inverter inverting the output signal. The latch circuit may include a first PMOS transistor connected between an output port of the first transmission circuit and the power supply voltage and including a gate connected to an output port of the inverter, and a second PMOS transistor connected between the power supply voltage and an output port of the latch circuit and including a gate connected to the output port of the first transmission circuit. The latch circuit may additionally include a first NMOS transistor connected at one end to the output port of the latch circuit and including a gate connected to the output port of the first transmission circuit, and a second NMOS transistor connected between the other end of the first NMOS transistor and a ground voltage and including a gate which receives the at least one pulse. The latch circuit may further include a second transmission circuit receiving a scan input signal and transmitting the scan input signal via an output port thereof based on at least two internal clock signals, and a latch connected to the output port of the latch circuit and to the output port of the second transmission circuit.

Another exemplary embodiment of the present invention is directed to a flip-flop. The flip-flop may include a control signal generator generating at least two pulses based on a clock signal and on a scan enable signal being in a first state, and generating at least two internal clock signals based on the clock signal and the scan enable signal being in a second state. A latch circuit of the flip-flop may be configured to latch an input signal received via a first input port of the flip-flop based on the at least two pulses, and may be configured to latch a scan input signal received via a second input port of the flip-flop based on the at least two internal clock signals.

Another exemplary embodiment of the present invention is directed to a flip-flop for performing latching and scanning operations therein. The flip-flop may be configured to generate at least two pulses and at least two internal clock signals to control latching one of an input signal as part of a latching operation and a scan signal as part of a scanning operation, based on a logic state of a received scan enable signal.

Another exemplary embodiment of the present invention is directed to a control signal generator for generating control signals to control operations in a device. The control signal generator may include a pulse generator configured to generate at least two pulses based on a received clock signal and a scan enable signal that is received in a first state, and an internal clock signal generator configured to generate at least two internal clock signals based on the received clock signal and the scan enable signal being received in a second state.

Another exemplary embodiment of the present invention is directed to a latch circuit for performing latching and scanning operations. The latch circuit may include a first transmission circuit receiving an input signal and generating a first output based on at least two pulses input thereto, a second transmission circuit receiving a scan input signal and generating a second output based on at least two internal clock signals input thereto, and a latch adapted to latch one of the first and second outputs.

Another exemplary embodiment of the present invention is directed to a method for controlling operations in a flip-flop. The method may include generating at least two pulse signals and at least two internal clock signals to control latching and scanning operations in the flip-flop, based on a received clock signal and on a state of a received scan enable signal that is input to the flip-flop. In the method, latching and scanning operations in the flip-flop may be controlled based on the at least two pulses and the at least two internal clock signals.

BRIEF DESCRIPTION OF THE DRAWINGS

The present invention will become more apparent by describing, in detail, exemplary embodiments thereof with reference to the attached drawings, wherein like elements are represented by like reference numerals, which are given by way of illustration only and thus do not limit the exemplary embodiments of the present invention.

DETAILED DESCRIPTION OF THE EXEMPLARY EMBODIMENTS

Exemplary embodiments of the present invention will be described below in more detail with reference to the accompanying drawings. The present invention may, however, be embodied in different forms and should not be constructed as limited to the exemplary embodiments set forth herein. Rather, these exemplary embodiments are provided so that this disclosure will be thorough and complete, and will fully convey the scope of the invention to those skilled in the art. Like numerals refer to like elements throughout the specification.

Figure 4:
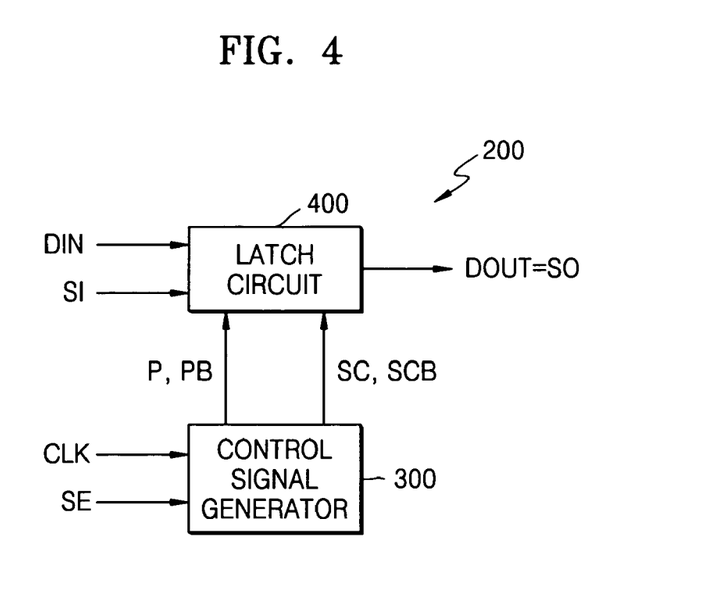
FIG. 4 is a block diagram of a pulse-based flip-flop having a scanning function, according to an exemplary embodiment of the present invention.

FIG. 4 is a block diagram of a pulse-based flip-flop 200 with scanning function according to an exemplary embodiment of the present invention. FIG. 4 should be occasionally read with respect to the timing diagram of FIG. 9. The pulse-based flip-flop 200 may be an example of a signal (or data) storage circuit and may perform latching and/or scanning operations at a substantially high speed and with relatively low power.

The pulse-based flip-flop 200 may include a control signal generator 300 and a latch circuit 400. The control signal generator 300 may generate at least two (or more) complementary pulses P and PB (i.e., a pulse P and its complement PB) based on a clock signal CLK and a scan enable signal SE being in a first logic state (e.g., logic low). This may be seen in FIG. 9. The control signal generator 300 may also generate at least two (or more) complementary internal clock signals SC and SCB (i.e., an internal clock signal SC and its complement SCB), based on the clock signal CLK and the scan enable signal SE being in a second logic state (e.g., logic high). This may also be seen in FIG. 9. The complementary pulses P and PB and the complementary internal clock signals SC and SCB may be mutually exclusive or independent.

For example, if the scan enable signal SE is in the first logic state, the latch circuit 400 may latch an input signal DIN received via a first input port, based on states of the complementary pulses P and PB. In other words, the latch circuit 400 performs what may be referred to as 'normal latching'. On the other hand, if the scan enable signal SE is in the second logic state, the latch circuit 400 latches a scan input signal SI received via a second input port, based on the complementary internal clock signals SC and SCB. In other words, the latch circuit 400 performs a scanning operation.

Figure 5:
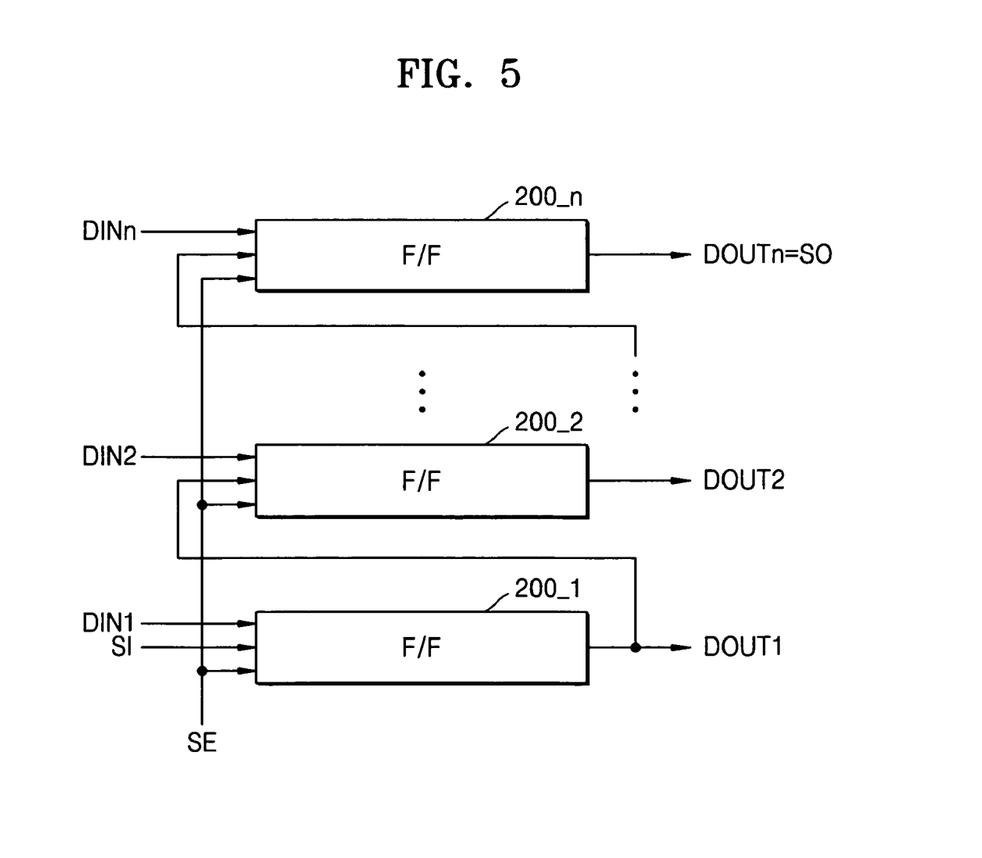
FIG. 5 is a connection diagram of pulse-based flip-flops as shown in FIG. 4.

FIG. 5 is a connection diagram of pulse-based flip-flops as shown in FIG. 4. Referring to FIGS. 4 and 5, a first flip-flop 200_1 may output either an input signal DIN1 or a scan input signal SI as an output signal DOUT1, based on the state of the scan enable signal SE. A second flip-flop 200_2 may output either an input signal DIN2 or the output signal DOUT1 as an output signal DOUT2, based on the state of the scan enable signal SE. The output signal DOUT1 may be used as a scan input signal (or scan input data) of the second flip-flop 200_2. An n-th flip-flop 200_n may thus output either an input signal DIN1n or a signal output by a ((n−1))th flip-flop (not shown) as an output signal DOUTn, based on the state of the scan enable signal SE. The output signal DOUTn output by the n-th flip-flop 200_n may be referred to as a scan output signal SO.

In other words, when the scan enable signal SE is in the first state (e.g., logic low), each of the flip-flops 200_1 through 200_n may latch each of the input signals DIN1 through DINn based on the logic states of the pulses P and PB and outputs a corresponding latched signal as each of the output signals DOUT1 through DOUTn. On the other hand, when the scan enable signal SE is in the second state (e.g., logic high), that is, when each of the flip-flops 200_1 through 200_n are performing a scanning operation, each of the flip-flops 200_1 through 200_n performs a shift register function. Accordingly, the scan input signal SI passes through the flip-flops 200_1 through 200_n in sequence based on logic states of the complementary internal clock signals SC and SCB. Finally, the scan input signal SI is output as the scan output signal SO from the n-th flip-flop 200_n. Accordingly, operation of each of the flip-flops 200_1 through 200_n may be properly tested based on the state SE being in a given logic state.

Therefore, an exemplary method of controlling a pulse-based flip-flop such as flip-flop 200, or of controlling operation of a latch circuit such as the latch circuit 400 in a pulse-based flip-flop may include latching one of a first input signal (DINn) as part of a normal latching operation and a second input signal (the scan signal SI) as part of a scanning operation, depending on the state of the input scan enable signal SE. For a plurality of connected flip-flops, the input signals DINn may be selectively latched in sequence based on the logic states of the pulse P, PB, when the SE is in a first state, so as to generate an output signal (DOUTn). Otherwise with the SE in the second state, the scan signals may be selectively latched in a sequence based on the logic states of the internal clock signals SC, SCB, so as to generate the DOUTn.

Figure 6:
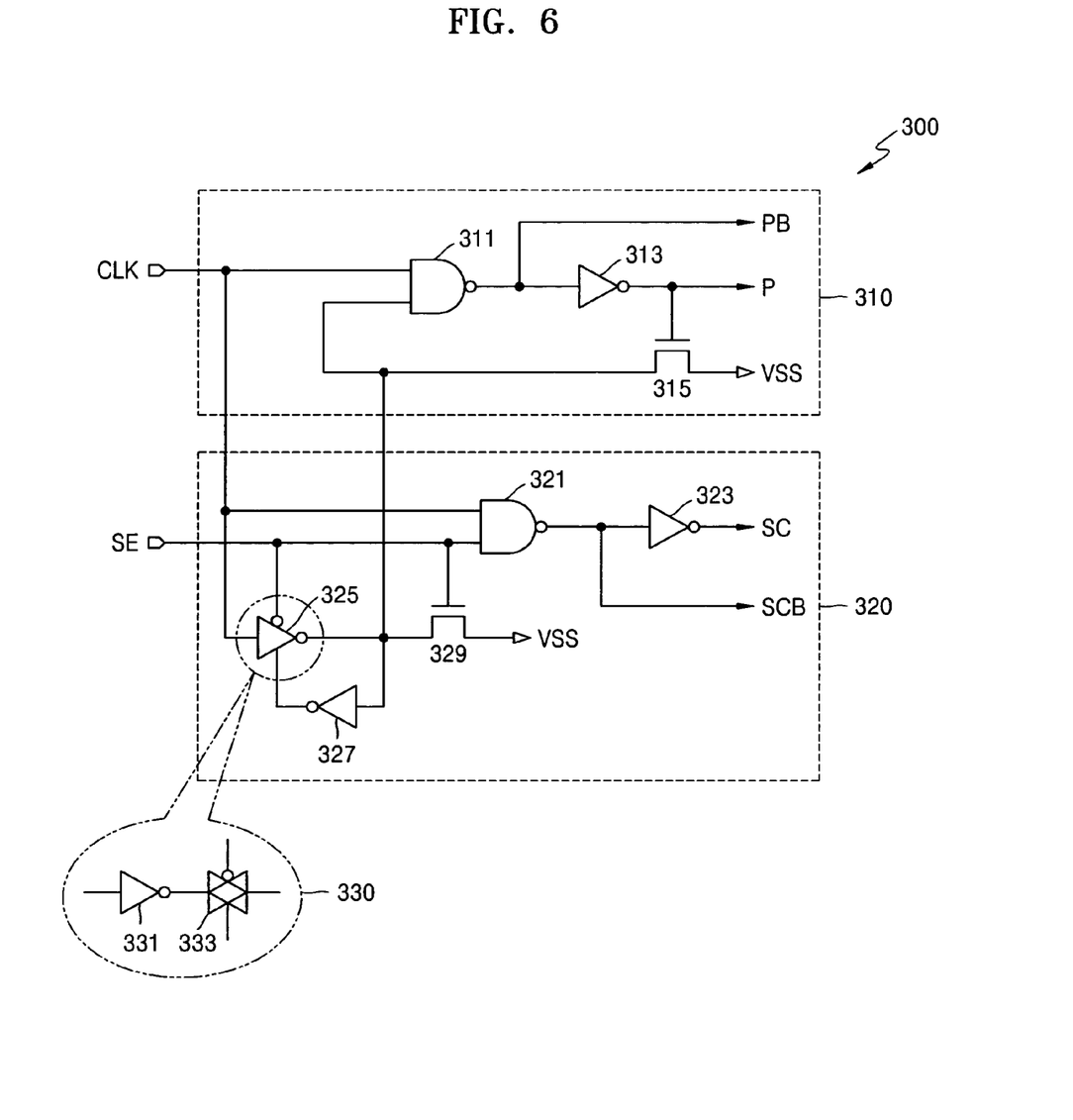
FIG. 6 is a circuit diagram of a control signal generator shown in FIG. 4.

FIG. 6 is a circuit diagram of the control signal generator 300 of FIG. 4. The control signal generator 300 may include a pulse generator 310. The pulse generator 310 may be configured to generate the complementary pulses P and PB based on the clock signal CLK and the scan enable signal SE in the first state (e.g., logic low).

The pulse generator 310 may include a first NAND gate 311, a first inverter 313 and a first switching circuit 315. The first NAND gate 311 receives the clock signal CLK through a first input port and a signal through a second input port, NANDs (i.e., performs a NAND operation on) the received signals to generate a first pulse PB. The first inverter 313 inverts the received first pulse PB to generate a second pulse P. The first switching circuit 315 may be embodied as an NMOS transistor, for example, that is connected between a ground voltage VSS and the second input port of the first NAND gate 311. The first switching circuit 315 (NMOS transistor) is off (de-energized) when the scan enable signal SE is at a logic high (second state), and may be switched on in response to the second pulse P received through a control port (i.e., a gate) of the first switching circuit 315 (as in a case where SE is at logic low (i.e., a first state).

As shown in FIG. 6, the control signal generator may include an internal clock signal generator 320. The internal clock signal generator 320 generates the complementary internal clock signals SC and SCB based on the clock signal CLK and the scan enable signal SE in the second state (e.g., logic high).

The internal clock signal generator 320 may include a second NAND gate 321, a second inverter 323, a transmission circuit 325, a third inverter 327, and a second switching circuit 329. The second NAND gate 321 receives the scan enable signal SE and the clock signal CLK, and NANDs the received signals so as to generate the first internal clock signal SCB. The second inverter 323 inverts the received first internal clock signal SCB so as to generate the second internal clock signal SC. In an example, the first and second internal clock signals SCB and SC may be synchronized with the clock signal CLK and serve as part of the output of the control signal generator 300, in additional to the first and second pulses PB, P.

The second switching circuit 329 may be embodied as an NMOS transistor, for example, that is connected between the ground voltage VSS and the second input port of the first NAND gate 311. The second switching circuit 329 (NMOS transistor) is de-energized when the scan enable signal SE is in a first state (logic low), but may be switched on in response to the scan enable signal SE received at a second state (logic high) through a control port (i.e., a gate) of the second switching circuit 329. The third inverter 327 inverts a signal received at the second input port of the first NAND gate 311, as shown in FIG. 6.

The transmission circuit 325 may be embodied as a tri-state buffer and may be configured to transmit the clock signal CLK to the second input port of the first NAND gate 311, based on the scan enable signal SE and an output signal of the third inverter 327. Alternatively, a transmission circuit 330 comprised of an inverter 331 and a transmission gate 333 may be used in place of the tri-state buffer 325, as shown in FIG. 6. The inverter 331 inverts the received clock signal CLK. The transmission gate 333 may be embodied as (and/or implemented by using) a PMOS transistor and a NMOS transistor. The transmission gate 333 may transmit an output signal of the inverter 331 to the second input port of the first NAND gate 311 based on the scan enable signal SE and the output signal of the third inverter 327, as shown in FIG. 6.

Accordingly, the control signal generator 300 may therefore generate at least a pair of pulse signals (PB, P) and at least a pair of internal clock generator signals (SCB, SC) for controlling one or both of latching and scanning operations in a pulse-based flip-flop (or in a latch circuit of the flip-flop) based on a clock signal and a state of a scan enable signal that is input thereto.

Figure 7:
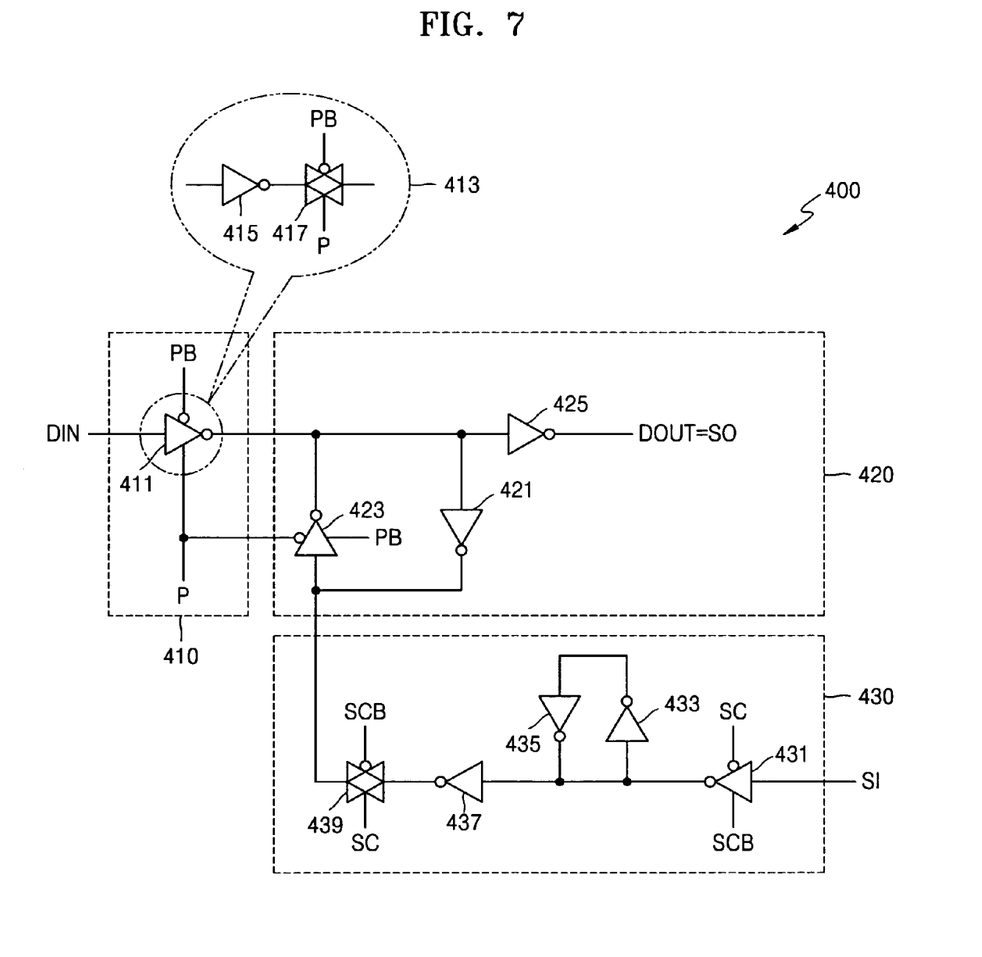
FIG. 7 is a exemplary circuit diagram of the latch circuit shown in FIG. 4.

FIG. 7 is a circuit diagram of the latch circuit 400 shown in FIG. 4 in accordance with an exemplary embodiment of the present invention. Referring to FIG. 7, the latch unit 400 may include a first and second transmission circuits 410 and 430 and a latch 420. The first transmission circuit 410 may receive the input signal DIN and outputs the same through its output port based on the pulses P and PB received thereto (for example, based on the logic states of the received pulses P and PB). The first transmission circuit 410 may be implemented by and/or embodied by using a tri-state buffer 411. Alternatively, a transmission circuit 413 may be used in place of the tri-state buffer 411. The transmission circuit 413 may include an inverter 415 for inverting the input signal DIN received thereto, and a transmission gate 417 for transmitting an output from the inverter 415 to an output port of the first transmission circuit 410, based on the pulses P and PB.

The latch unit 400 may include a second transmission circuit 430. The second transmission circuit 430 receives the scan input signal SI and may selectively outputs the SI through its output port based on logic states of the internal clock signals SC and SCB. The second transmission circuit 430 may include a tri-state buffer 431, a latch comprised of serially-connected inverters 433 and 435, an inverter 437, and a transmission gate 439.

The tri-state buffer 431 may output the scan input signal SI through its output port based on logic states of the internal clock signals SC and SCB. The tri-state buffer 431 may be replaced by the aforementioned transmission circuit 413, including the inverter 415 and transmission gate 417. The serially connected inverters 433 and 435 may represent a latch that latches the signal output from the output port of the tri-state buffer 431.

Inverter 437 inverts the signal output from the output port of the tri-state buffer 431. The transmission gate 439 is connected between an output port of the inverter 437 and an output port of the inverter 421. A transmission circuit comprised of the inverter 437 and the transmission gate 439 may be replaced by a tri-state buffer, for example.

The latch unit 400 may include a latch 420. The latch 420 is connected between output ports of the first and second transmission circuits 410 and 430 and selectively latches a signal output by the first transmission circuit 410 or a signal output by the second transmission circuit 430, based on the pulses P and PB (i.e., based on the logic states of the pulses P, PB input thereto).

The latch 420 includes the inverter 421 and a tri-state buffer 423. The inverter 421 is connected between an output port of the tri-state buffer 411 and the output port of the transmission gate 439. The tri-state buffer 423 transmits a received signal based on the logic states of the pulses P and PB. The tri-state buffer 423 may be replaced by the transmission circuit 413. Moreover, any tri-state buffer mentioned herein may be replaced by the transmission circuit 413. The latch circuit 400 latches either the input signal DIN or the scan input signal SI, depending on the logic state of the scan enable signal SE. The latch 420 further includes an inverter 425 that inverts a signal output by the tri-state buffer 411 of the first transmission circuit 410 so as to generate the output signal DOUT.

In this example, a latch composed of the inverter 421 and the tri-state buffer 423 does not serve as a burden between input and output ports of the latch circuit 400. In other words, the latch circuit 400 performs scanning without any input-output delay there through. A path from the input signal DIN to the output signal DOUT (which may be referred to as a 'normal path') may be different from a path from the scan input signal SI to the scan output signal SO (which may be referred to as a 'scan path'), so the latching circuit 400 reduces power loss caused by switching of the normal path.

Figure 8:
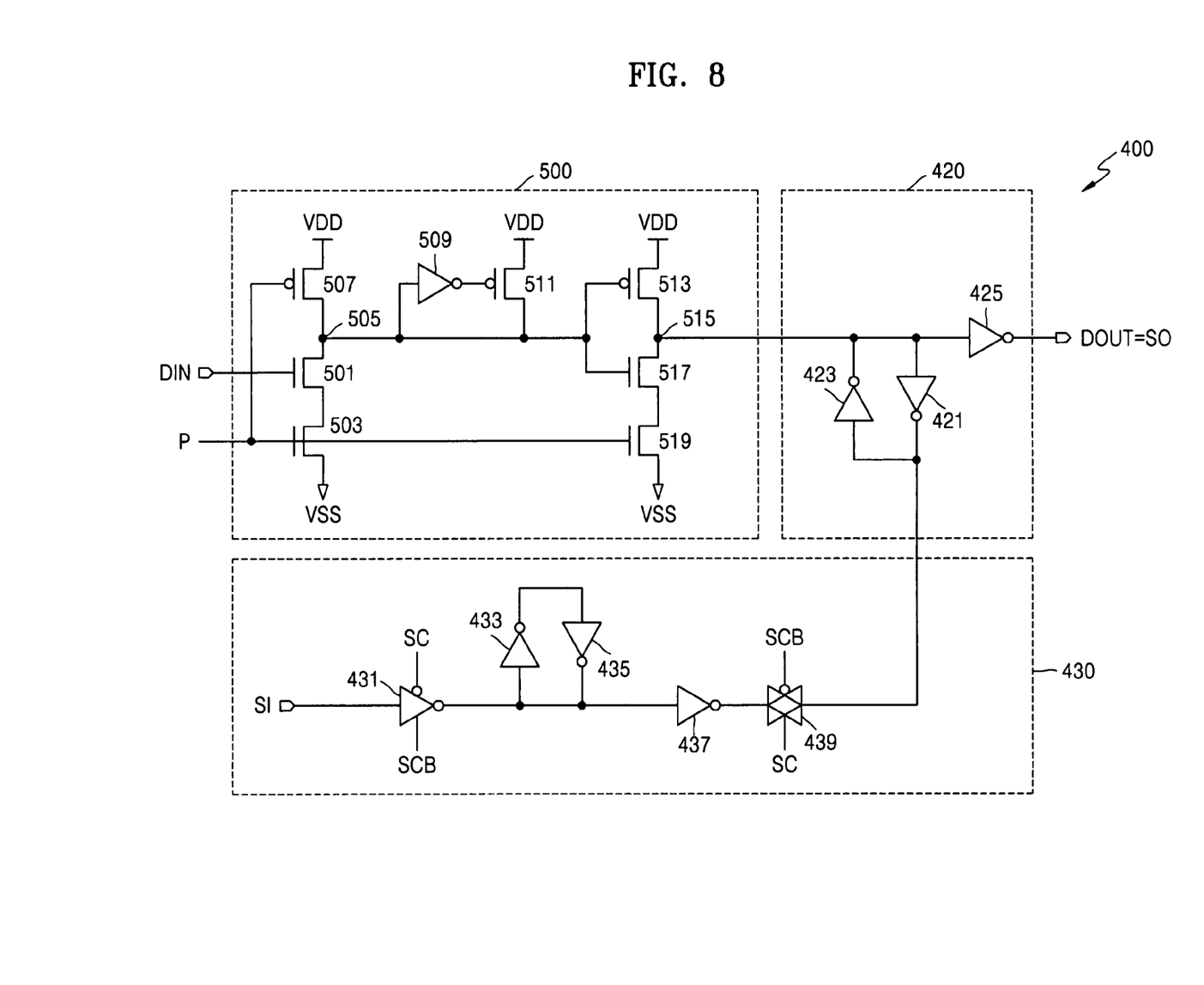
FIG. 8 is another exemplary circuit diagram of the latch circuit shown in FIG. 4.

FIG. 8 is an exemplary circuit diagram for the latch circuit 400 of FIG. 4, in accordance with another exemplary embodiment of the present invention. Referring to FIG. 8, the latch circuit 400 may also include a first transmission circuit 500, second transmission circuit 430 and latch 420, as previously discussed with respect to FIG. 7. However, unlike the first transmission circuit 410 of FIG. 7, the first transmission circuit 500 of FIG. 8 may include a plurality of transistors (see transistors 501, 503, 507, 511, 513, 517, 519) and an inverter 509.

The first transmission circuit 500 may output one of a power supply voltage VDD, a ground voltage VSS and a high impedance value based on the input signal DIN and the pulse P. As shown in FIG. 8, the NMOS transistor 501 has one end connected to a node 505 and a gate through which the input signal DIN is received. The NMOS transistor 503 may be connected between the other end of the NMOS transistor 501 and the ground voltage VSS and has a gate through which the pulse P is received.

The PMOS transistor 507 may be connected between the power supply voltage VDD and the node 505 and has a gate through which the pulse P is received. The inverter 509 is connected between node 505 and a gate of the PMOS transistor 511. The PMOS transistor 511 is connected between node 505 and the power supply voltage VDD and may supply the power supply voltage VDD to the node 505 in response to an output signal from inverter 509.

The PMOS transistor 513 may be connected between the power supply voltage VDD and a node 515 and has a gate connected to node 505. The PMOS transistor 513 may supply the power supply voltage VDD to the node 515 in response to a voltage of the node 505.

One end of the NMOS transistor 517 may be connected to node 515, and a gate thereof is connected to node 505. The NMOS transistor 519 may be connected between the other end of the NMOS transistor 517 and has a gate through which the pulse P is received.

The second transmission circuit 430 receives the scan input signal SI and transmits the SI through its output port based on the internal clock signals SC and SCB (i.e., based on the logic states of SC and SCB). A latch comprised of the inverter 421 and the tri-state buffer 423 latches either an output signal from node 515 or an output signal from the transmission gate 439. The inverter 425 inverts the output signal from node 515 and outputs a result of the inversion as the output signal DOUT.

Figure 9:
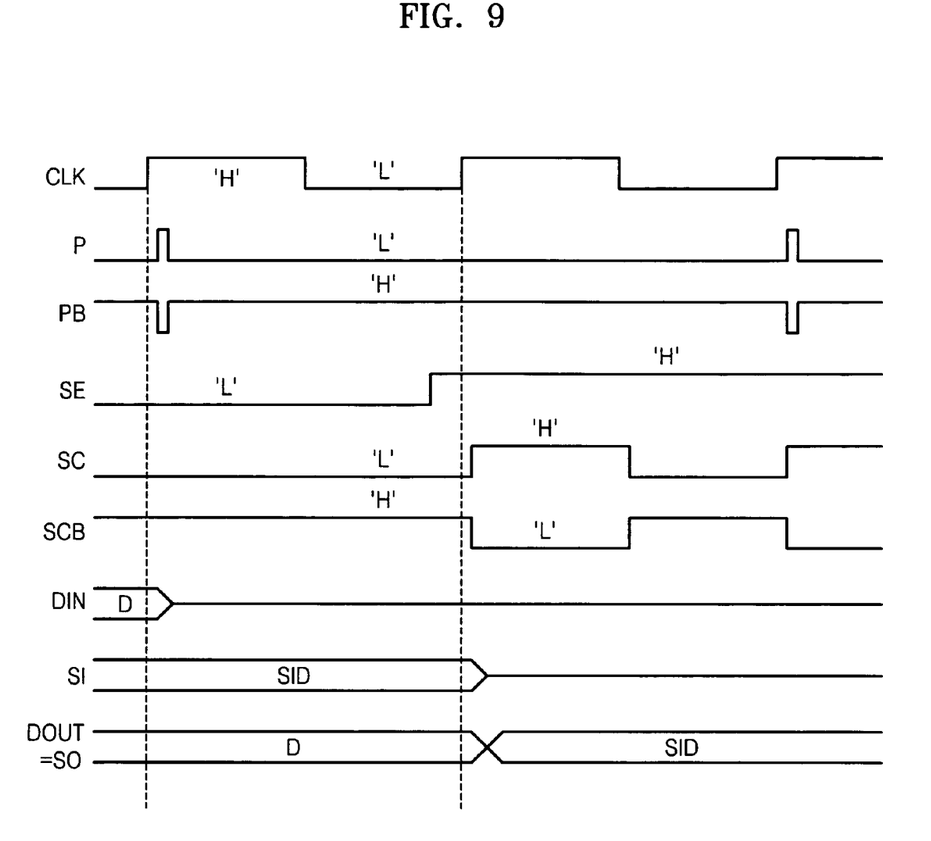
FIG. 9 is a timing diagram of the pulse-based flip-flop of FIG. 4.

FIG. 9 is a timing diagram of the pulse-based flip-flop 200 of FIG. 4. Operation of the pulse-based flip-flop 200 may be described with occasional reference to FIGS. 4, 6, 7, and 9. If the state of the scan enable signal SE is logic low, the first and second internal clock signals SCB and SC are logic high and logic low, respectively, regardless of a logic state of the clock signal CLK. As shown in FIG. 9, the pulse generator 310 generates the pulse P (and the complementary pulse PB), at a given pulse width, in response to a rising edge of the clock signal CLK.

When the tri-state buffer 411 (see FIG. 7) of the latch circuit 400 outputs a signal having a phase opposite to a phase of the input signal DIN through its output port (based on the pulses P and PB), the latch comprised of inverter 421 and tri-state buffer 423 latches this output signal, the inverter 425 inverts this output signal received from the tri-state buffer 411 via the latch (inverter 421/tri-state buffer 423) and outputs a signal at an opposite phase than that of the received output signal as the output signal DOUT. Hence, with the scan enable signal SE at a logic low, the flip-flop 200 normally latches the input signal DIN.

On the other hand, if the scan enable signal SE is at a logic high, the NMOS transistor 329 (see FIG. 6) is turned on, and the pulse PB output by the first NAND gate 311 is maintained at a logic high regardless of a logic state of the clock signal CLK. Hence, the pulse P may be maintained at a logic low. Accordingly, the second NAND gate 321 may output the first internal clock signal SCB, having a phase opposite to that of the clock signal CLK, and the inverter 323 outputs the second internal clock signal SC, having the same phase as that of the clock signal CLK. Hence, the tri-state buffer 411 of the latch circuit 400 may be deactivated.

When the tri-state buffer 431 outputs a signal having a phase opposite to that of a scan input signal SID (based on the logic states of the internal clock signals SC and SCB) the latch comprised of the inverters 433 and 435 latches this output signal. The inverter 437 inverts the latched output signal to output a signal at an opposite phase opposite to that of the signal output by tri-state buffer 431. The transmission gate 439 may transmit this output signal from the inverter 437 to latch 420 based on the internal clock signals SC and SCB, as shown in FIG. 7.

Accordingly, the latch comprised of the inverters 421 and 423 latches the output signal of the transmission gate 439. At this time, the tri-state buffer 423 has already been activated in response to the pulses P and PB. The inverter 425 outputs the scan output signal SO so that it has the same phase as the scan input signal SID. Thus, with the scan enable signal SE at a logic high, the flip-flop 200 performs a scanning operation.

Accordingly, the exemplary embodiments of the present invention have illustrated a latch circuit that may be configurable for use in a flip-flop and which may be capable of performing substantially fast signal-latching and scanning with relatively low power, a control signal generator generating control signals to control operations of the latch circuit and/or flip-flop, a flip-flop including the latch circuit and control signal generator, and methodologies for controlling operations in one or more of the exemplary control signal generator, latching circuit and flip-flop.

Therefore, the exemplary embodiments describe a flip-flop 200 which may be configured to latch one of a first input signal (DIN) and a second input signal (scan input signal SID) based on the state of a scan enable signal SE received by the flip-flop 200. Operations in a pulse-based flip-flop such as flip-flop 200 may thus be controlled, and/or operation of a latch circuit such as the latch circuit 400 may be controlled, by latching one of a first input signal (DINn) as part of a normal latching operation and a second input signal (the scan signal SI) as part of a scanning operation, depending on the state of the input scan enable signal SE. This may provide a flip-flop which can perform substantially fast latching or scanning operations at substantially low power, since the flip-flop 200 does not require a separate, dedicated scan circuit.

The exemplary embodiments of the present invention being thus described, it will be obvious that the same may be varied in many ways. Such variations are not to be regarded as departure from the spirit and scope of the exemplary embodiments of the present invention, and all such modifications as would be obvious to one skilled in the art are intended to be included within the scope of the following claims.

What is claimed is:

1. A latch circuit, comprising:
   a first transmission circuit receiving an input signal and transmitting the input signal via an output port thereof based on at least two pulses, a first pulse of the at least two pulses generated by a first NAND gate, and a second pulse of the at least two pulses generated by a first inverter inverting the first pulse,
   a second transmission circuit receiving a scan input signal and transmitting the scan input signal via an output port thereof based on at least two internal clock signals, and
   a first latch connected between the output ports of the first and second transmission circuits for latching an output signal from one of the first and second transmission circuits based on the at least two pulses and including
      a tri-state buffer connected between the output ports of the first and second transmission circuits and receiving the at least two pulses as control signals, and
      an inverter connected to an output of the tri-state buffer.

2. The latch circuit of claim 1, wherein the first transmission circuit is embodied as a tri-state buffer.

3. The latch circuit of claim 1, wherein the first transmission circuit includes:
   an inverter inverting the input signal to generate an output signal, and
   a transmission gate transmitting the output signal to the first transmission circuit output port based on the at least two pulses.

4. The latch circuit of claim 1, further comprising an inverter connected to an output port of the first latch.

5. The latch circuit of claim 1, wherein the second transmission circuit includes:
   a tri-state buffer transmitting the scan input signal based on the at least two internal clock signals,
   a second latch latching a signal received from an output port of the tri-state buffer,
   an inverter having an input port connected to the output port of the tri-state buffer, and
   a transmission gate connected between an output port of the inverter and the output port of the second transmission circuit.

6. The latch circuit of claim 1, wherein the second transmission circuit includes:
   a first tri-state buffer transmitting the scan input signal based on the at least two internal clock signals,
   a second latch latching a signal from an output port of the first tri-state buffer, and
   a second tri-state buffer connected between the output port of the first tri-state buffer and the output port of the second transmission circuit and transmitting the signal in the output port of the first tri-state buffer through the output port of the second transmission circuit, based on the at least two internal clock signals.

7. The latch circuit of claim 1, wherein
   the latch circuit is part of a flip-flop, and
   the at least two pulses and at least two internal clock signals are adapted to control one of a latching operation and a scanning operation in the flip-flop depending on the state of a scan enable signal received by the flip-flop.

8. A flip-flop including the latch circuit of claim 1 and a control signal generator for generating the at least two pulses and the at least two internal clock signals to control operations of the latch circuit.

9. A latch circuit, comprising:
   a first transmission circuit outputting, as an output signal, one of a power supply voltage, a ground voltage and a high impedance value of the first transmission circuit based on an input signal and at least one pulse,
   an inverter inverting the output signal;
   a first PMOS transistor connected between an output port of the first transmission circuit and the power supply voltage and including a gate connected to an output port of the inverter,
   a second PMOS transistor connected between the power supply voltage and an output port of the latch circuit and including a gate connected to the output port of the first transmission circuit,
   a first NMOS transistor connected at one end to the output port of the latch circuit and including a gate connected to the output port of the first transmission circuit,
   a second NMOS transistor connected between the other end of the first NMOS transistor and a ground voltage and including a gate which receives the at least one pulse,
   a second transmission circuit receiving a scan input signal and transmitting the scan input signal via an output port thereof based on at least two internal clock signals, and
   a latch connected to the output port of the latch circuit and to the output port of the second transmission circuit.

10. The latch circuit of claim 9, wherein the latch includes first and second inverters that are serially connected to each other.

11. A flip-flop including the latch circuit of claim 9 and a control signal generator for generating the at least two pulses and the at least two internal clock signals to control operations of the latch circuit.

12. A flip-flop comprising:
a control signal generator generating at least two pulses based on a clock signal, and on a scan enable signal being in a first state, and generating at least two internal clock signals based on the clock signal, and on the scan enable signal in a second state, a first pulse of the at least two pulses generated by a first NAND gate, and a second pulse of the at least two pulses generated by a first inverter inverting the first pulse, and
a latch circuit latching an input signal received via a first input port of the flip-flop based on the at least two pulses and latching a scan input signal received via a second input port of the flip-flop based on the at least two internal clock signals, wherein the latch circuit includes;
a tri-state buffer connected between the output ports of the first and second transmission circuits and receiving the at least two pulses as control signals, and
an inverter connected to an output of the tri-state buffer.

13. The flip-flop of claim 12, wherein the control signal generator includes:
the first NAND generating the first pulse based on a clock signal received at a first input port and the input signal received at a second input port,
the first inverter inverting the first pulse to generate the second pulse,
a first switching circuit connected between a ground voltage and the second input port and switched on in response to the second pulse received via a control port of the first switching circuit,
a second NAND gate generating a first internal clock signal based on a scan enable signal and the clock signal,
a second inverter inverting the first internal clock signal to generate a second internal clock signal,
a second switching circuit connected between the second input port and the ground voltage and switched on in response to the scan enable signal received via a control port of the second switching circuit,
a third inverter inverting the signal from the second input port to generate an output signal, and
a transmission circuit transmitting the clock signal to the second input port based on the scan enable signal and an output signal from the third inverter.

14. The flip-flop of claim 12, wherein the latch circuit includes:
a first transmission circuit transmitting the input signal via an output port thereof based on the at least two pulses,
a second transmission circuit transmitting the scan input signal via an output port thereof based on the at least two internal clock signals, and
a latch connected between the output ports of the first and second transmission circuits and latching an output signal from one of the first and second transmission circuits, based on the at least two pulses.

15. The flip-flop of claim 12, wherein the latch circuit includes,
a first transmission circuit outputting, as an output signal, one of a power supply voltage, a ground voltage and an impedance value based on an input signal and at least one pulse,
an inverter inverting the output signal,
a first PMOS transistor connected between an output port of the first transmission circuit and a power supply voltage and including a gate connected to an output port of the inverter,
a second PMOS transistor connected between the power supply voltage and an output port of the latch circuit and including a gate connected to the output port of the first transmission circuit,
a first NMOS transistor connected at one end to the output port of the latch circuit and including a gate connected to the output port of the first transmission circuit,
a second NMOS transistor connected between the other end of the first NMOS transistor and a ground voltage and including a gate which receives the at least one pulse,
a second transmission circuit receiving a scan input signal and transmitting the scan input signal via an output port thereof based on at least two internal clock signals, and
a latch connected to the output port of the latch circuit and to the output port of the second transmission circuit.

16. A flip-flop for performing latching and scanning operations therein, the flip-flop including:
a control signal generator to generate at least two pulses and at least two internal clock signals to control latching one of an input signal as part of a latching operation and a scan signal as part of a scanning operation, based on a logic state of a received scan enable signal, wherein,
a first pulse of the at least two pulses generated by a first NAND gate of the control signal generator, and a second pulse of the at least two pulses generated by a first inverter of the control signal generator inverting the first pulse; and
a latch circuit for latching the input signal based on the at least two pulses, and for latching a scan input signal based on the at least two internal clock signals, wherein the latch circuit includes
a tri-state buffer connected between the output ports of a first and a second transmission circuit and receiving the at least two pulses as control signals, and
an inverter connected to an output of the tri-state buffer.

17. The flip-flop of claim 16, wherein
the flip-flop latches the input signal as part of the latching operation, if the scan enable signal is received at a first state,
else the flip-flop latches the input scan signal as part of the scanning operation, if the scan enable signal is received at a second state.

18. The flip-flop of claim 16, wherein logic states of the at least two pulses and the at least two internal clock signals are dependent on the state of the scan enable signal.

19. The flip-flop of claim 16, wherein
the latch circuit latches the input signal as part of the latching operation based on the states of the at least two pulses, if the scan enable signal is at a first state,
else the latch circuit latches the input scan signal as part of the scanning operation based on the states of the at least two internal clock signals, if the scan enable signal is at a second state.

20. The flip-flop of claim 16, wherein the flip-flop does not include a dedicated scan circuit to perform the scanning operation.

21. A latch circuit for performing latching and scanning operations, comprising:
a first transmission circuit receiving an input signal and generating a first output based on at least two pulses input thereto, a first pulse of the at least two pulses generated by a first NAND gate, and a second pulse of the at least two pulses generated by a first inverter inverting the first pulse, a second transmission circuit receiving a scan input signal and generating a second output based on at least two internal clock signals input thereto, and a latch adapted to latch one of the first and second outputs, the latch comprising a tri-state buffer connected between the output ports of the first and the second transmission circuit and receiving the at least two pulses as control signals, and an inverter connected to an output of the tri-state buffer.

22. The latch circuit of claim 21, wherein the latch circuit is part of a flip-flop that is configured to receive a scan enable signal, and the at least two pulses and at least two internal clock signals control operations of the latch circuit based on a logic state of the received scan enable signal.

23. The latch circuit of claim 22, wherein the operations include a latching operation to latch an input signal and a scanning operation to verify proper operation of the flip-flop.

24. A flip-flop including the latch circuit of claim 21 and a control signal generator for generating the at least two pulses and the at least two internal clock signals to control operations of the latch circuit.

25. A method for controlling operations in a flip-flop comprising:

generating at least two pulse signals and at least two internal clock signals to control latching and scanning operations in the flip-flop, based on a received clock signal and on a state of a received scan enable signal input to the flip-flop, and controlling latching and scanning operations in the flip-flop based on the at least two pulse signals, and the at least two internal clock signals, wherein, a tri-state buffer connected between the output ports of a first and second transmission circuit receives the at least two pulses as control signals, an inverter connect to an output of the tri-state buffer, and a first pulse signal of the at least two pulse signals generated by a first NAND gate, and a second pulse signal of the at least two pulse signals generated by a first inverter inverting the first pulse signal.

26. A flip-flop controlling operations therein in accordance with the method of claim 25.

* * * * *